United States Patent
Jan et al.

(10) Patent No.: US 7,935,583 B2
(45) Date of Patent: May 3, 2011

(54) FABRICATION METHOD OF PIXEL STRUCTURE

(75) Inventors: Shiun-Chang Jan, Hsin-Chu (TW); Han-Tu Lin, Hsin-Chu (TW)

(73) Assignee: AU Optronics Corp., Science-Based Industrial Park, Hsin-Chu (TW)

(*) Notice: Subject to any disclaimer, the term of this patent is extended or adjusted under 35 U.S.C. 154(b) by 567 days.

(21) Appl. No.: 11/951,321

(22) Filed: Dec. 5, 2007

(65) Prior Publication Data

US 2009/0108280 A1    Apr. 30, 2009

(30) Foreign Application Priority Data

Oct. 26, 2007    (TW) ................ 96140324 A

(51) Int. Cl.
*H01L 21/00* (2006.01)
*H01L 21/84* (2006.01)

(52) U.S. Cl. ............... 438/155; 438/158; 438/161

(58) Field of Classification Search .......... 438/149, 438/151, 155, 158, 164
See application file for complete search history.

(56) References Cited

U.S. PATENT DOCUMENTS

| | | | |
|---|---|---|---|
| 6,818,923 B2 | 11/2004 | Kim | |
| 6,838,696 B2 | 1/2005 | Kobayashi | |
| 7,001,796 B2 | 2/2006 | Cho et al. | |
| 7,084,017 B2* | 8/2006 | Nakamura et al. | 438/149 |
| 2001/0048489 A1 | 12/2001 | Izumi et al. | |
| 2003/0086046 A1* | 5/2003 | You | 349/149 |
| 2003/0197187 A1* | 10/2003 | Kim et al. | 257/83 |
| 2005/0212986 A1 | 9/2005 | Kawasaki | |
| 2005/0260780 A1* | 11/2005 | Ahn | 438/30 |

FOREIGN PATENT DOCUMENTS

| | | |
|---|---|---|
| CN | 1328270 A | 12/2001 |
| CN | 1721959 A | 1/2006 |
| CN | 101030560 A | 9/2007 |

* cited by examiner

*Primary Examiner* — Savitri Mulpuri
*Assistant Examiner* — Calvin Choi
(74) *Attorney, Agent, or Firm* — Winston Hsu; Scott Margo

(57) ABSTRACT

A fabrication method of a pixel structure includes utilizing only a single photomask in two different lithographic processes for defining patterns of the source/drain and passivation layer respectively. Therefore, the total amount of photomasks of the fabrication process can be decreased.

19 Claims, 17 Drawing Sheets

FABRICATION METHOD OF PIXEL STRUCTURE

BACKGROUND OF THE INVENTION

1. Field of the Invention

The present invention provides a pixel structure and a fabrication method thereof, and more particularly, to a pixel structure and a fabrication method thereof utilizing a single photomask in two different lithographic processes for defining different patterns.

2. Description of the Prior Art

Due to the continued development in technology, flat displays have been applied to all kinds of information products, especially for thin-film transistor liquid crystal displays (TFT-LCDs) that are the most maturely developed. Because TFT-LCDs have qualities of light weight, low power consumption and no radiated pollution, they have been widely used in various portable information products, such as notebooks, personal digital assistants (PDAs), and etc. Furthermore, the TFT-LCD even has a potential to replace the cathode ray tube (CRT) monitor gradually. Pixel structures arranged as an array are main devices of the TFT-LCD, which comprise electronic devices, such as TFTs, capacitors, pads, and etc., for driving liquid crystal pixels in the production of brilliant images.

A typical fabrication process for a pixel structure of a conventional TFT-LCD has to perform five photolithography processes, which means five photomasks are needed for defining the patterns of the TFT. However, since the cost of photomasks seriously influences the display fabrication costs, a new fabrication process of the pixel structure by using four photomasks, including a half-tone mask or a gray-tone mask, has been researched in order to reduce the fabrication costs.

Referring to FIG. 1 through FIG. 6, FIG. 1 through FIG. 6 are schematic diagrams of a conventional fabrication process for fabricating a pixel array by using four photomasks. As shown in FIG. 1, first, a first conductive layer and a photoresist layer are formed on a transparent substrate 10 in sequence, and then, a first photolithography-etching process (PEP) is performed to form a gate 12 and a wire pattern 14.

Next, as shown in FIG. 2, an insulation layer 16, a semiconductor layer 18, an N+ doped layer 20, a second conductive layer 22 and a photoresist layer 24 are formed on the transparent substrate 10 in sequence. Then, as shown in FIG. 3, a second lithographic process is performed by using a half-tone mask 26. The half-tone region 26a of the half-tone mask 26 is corresponding to a predetermined channel pattern above the gate 12 so as to pattern the photoresist layer 24.

With reference to FIG. 4, next, the patterned photoresist layer 24 is utilized to be an etching mask, and a wet etching and a dry etching are performed for the transparent substrate 10 in sequence to remove a part of the semiconductor layer 18, the N+ doped layer 20 and the second conductive layer 22 so as to form a semiconductor island 32, a source 28 and a drain 30. As shown in FIG. 5, subsequently, a passivation layer 34 is deposited on the transparent substrate 10, and then, a third PEP is performed to form a contact hole 36 in the passivation layer 34 on the drain 30. Finally, as shown in FIG. 6, a transparent conductive layer is formed on the transparent substrate 10, and a fourth PEP is performed to remove a part of the transparent conductive layer on the semiconductor island 32 so as to form a pixel electrode 38. The pixel electrode 38 is electrically connected to the drain 30 through the contact hole 36.

As mentioned above, the conventional fabrication process of TFTs uses the half-tone mask during the second PEP process by taking its half-tone region to define the channel pattern of the TFT. Because the size of the channel pattern of the TFT is very detailed and minute, the half-tone mask for defining the channel pattern by its half-tone region has to be very accurate, whose costs is very high that is twice the cost of normal photomask. In addition, once a defect of the transference of the channel pattern occurs during the second PEP by using a half-tone mask, it will seriously affect the electric property of the TFT, which is hard to be repaired, so as to affect the electrical performance of the TFT.

Therefore, how to fabricate TFTs with lower-cost and practicable processes is still an important issue for the manufactures.

SUMMARY OF THE INVENTION

It is an objective of the present invention to provide a fabrication method of a pixel structure so that the total amount of photomasks of the fabrication process can be decreased by a method of reusing a photomask so as to reduce the cost of fabrication generated in the aforementioned method of the prior art.

According to the present invention, a fabrication method of a pixel structure is provided. First, a substrate is provided, and a gate and a pixel electrode are formed on the substrate. Next, a dielectric layer and a semiconductor layer are formed on the substrate in sequence, and then, the dielectric layer and the semiconductor layer are patterned to form a patterned dielectric layer and a patterned semiconductor layer on the gate. Subsequently, a conductive layer is formed on the substrate, and then, a first lithographic process is performed by utilizing a photomask to pattern the conductive layer so as to form a source and a drain on the patterned semiconductor layer, wherein the drain is electrically connected to the pixel electrode. Next, a passivation layer is formed on the substrate, and a second lithographic process is performed by utilizing the photomask to form a patterned passivation layer covering the source, the drain and the semiconductor layer, which exposes a part of the pixel electrode.

According to the present invention, a pixel structure is further provided. The pixel structure comprises a substrate, a gate and a pixel electrode that are disposed on the substrate, a patterned dielectric layer and a patterned semiconductor layer disposed on the gate, a source and a drain disposed on two sides of the patterned semiconductor layer respectively, and a passivation layer disposed on the source, the drain and the semiconductor layer. The sidewall surfaces of the source and the drain are completely covered with the passivation layer, but a part of the pixel electrode is exposed by the passivation layer.

The present invention utilizes a single photomask in the first and second lithographic process to define patterns of the source/drain and the passivation layer respectively so that the total amount of photomasks of the fabrication process can be decreased. Therefore, the fabrication costs can be reduced. Furthermore, according to the pixel structure fabricated by the method of the present invention, the sidewall surfaces of the source/drain are completely covered with the passivation layer so that the source/drain can be protected from damage generated by exposing the source/drain during the following assembly or operation. Therefore, the stability and the operating efficiency of the pixel structure can be effectively increased.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
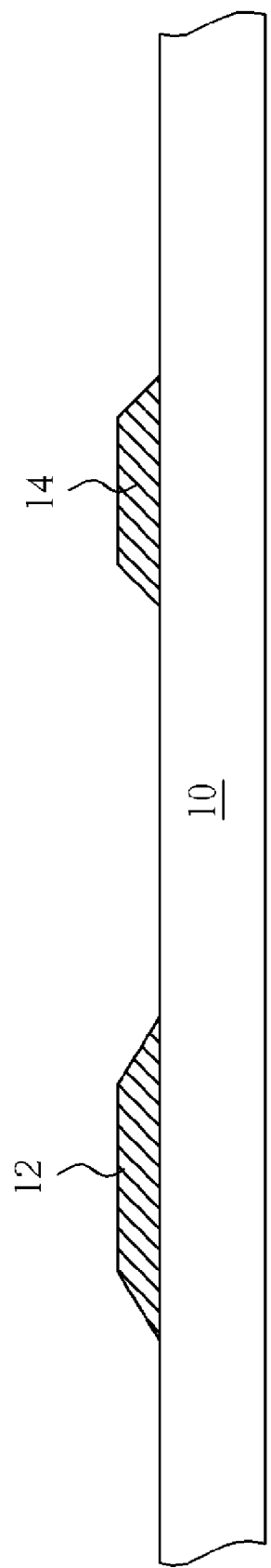
FIG. 1 through FIG. 6 are schematic diagrams of a conventional fabrication process for fabricating a TFT by using four photomasks.
Figure 2:
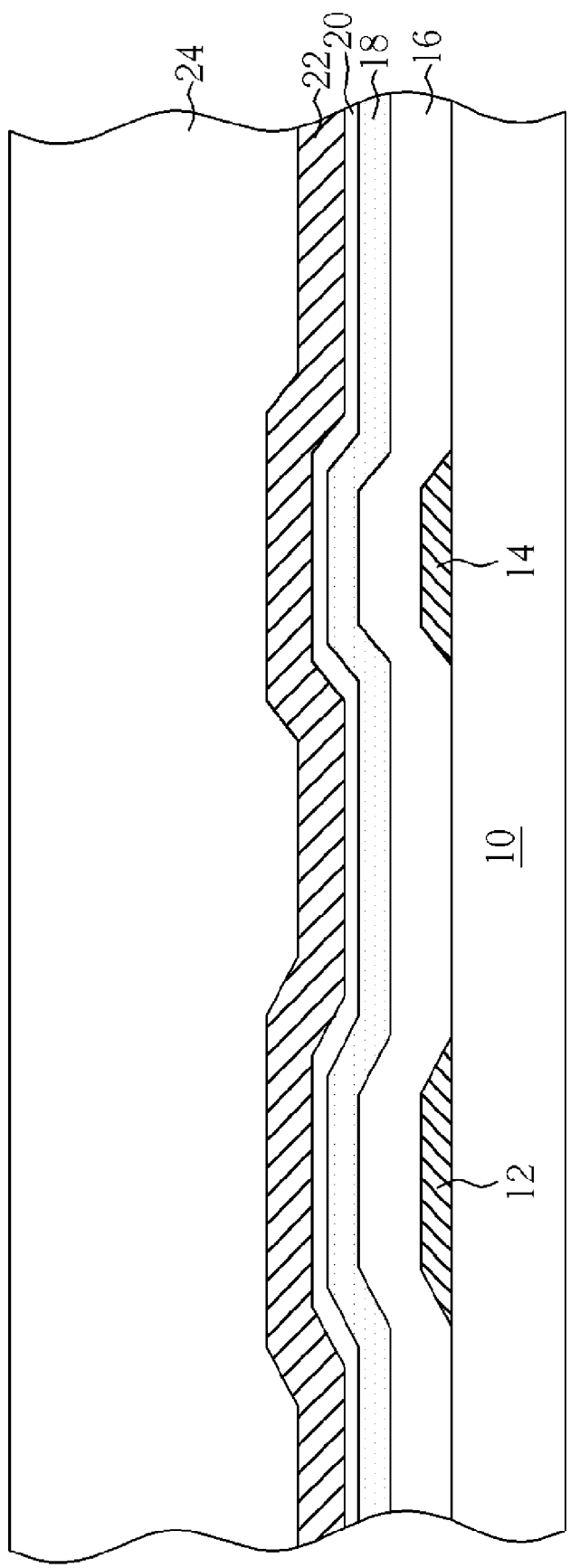
Figure 3:
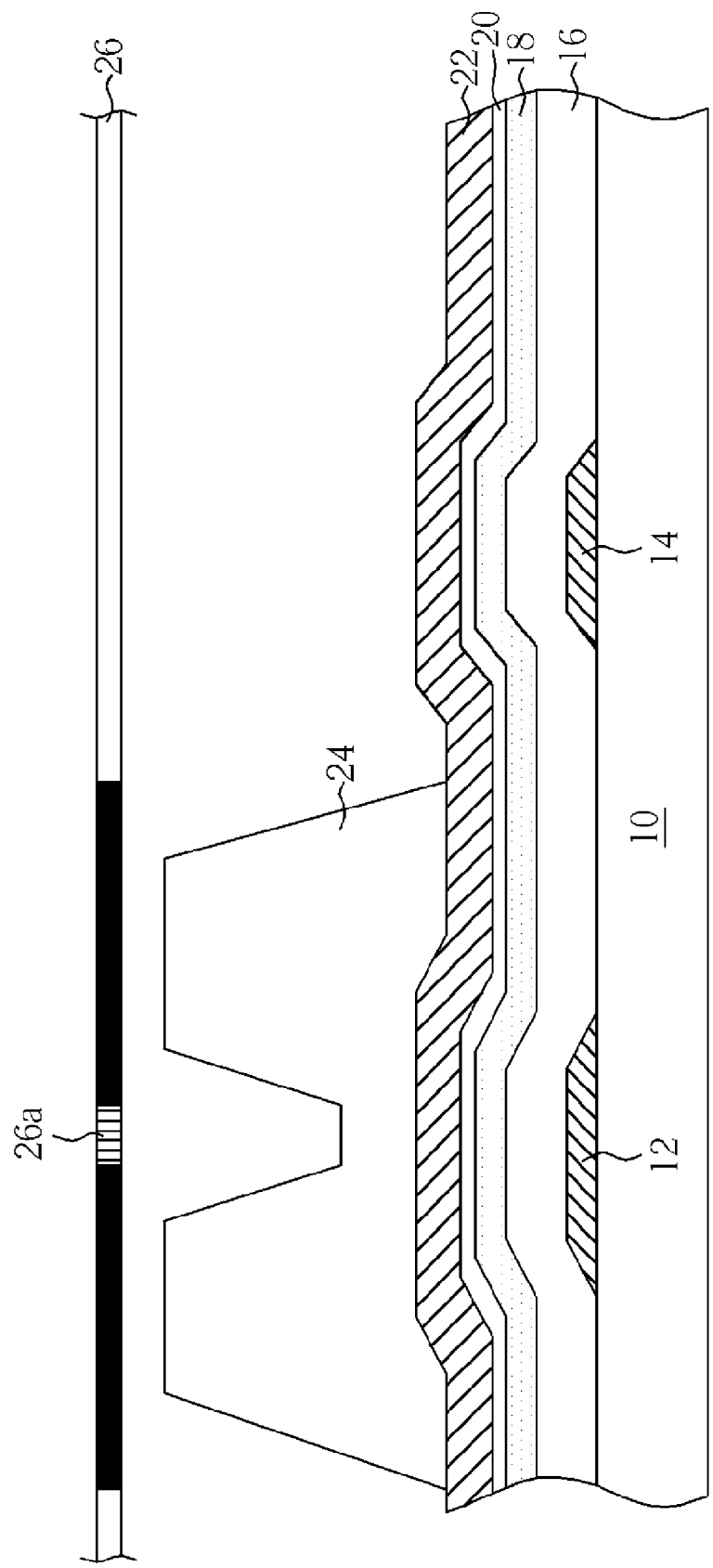
Figure 4:
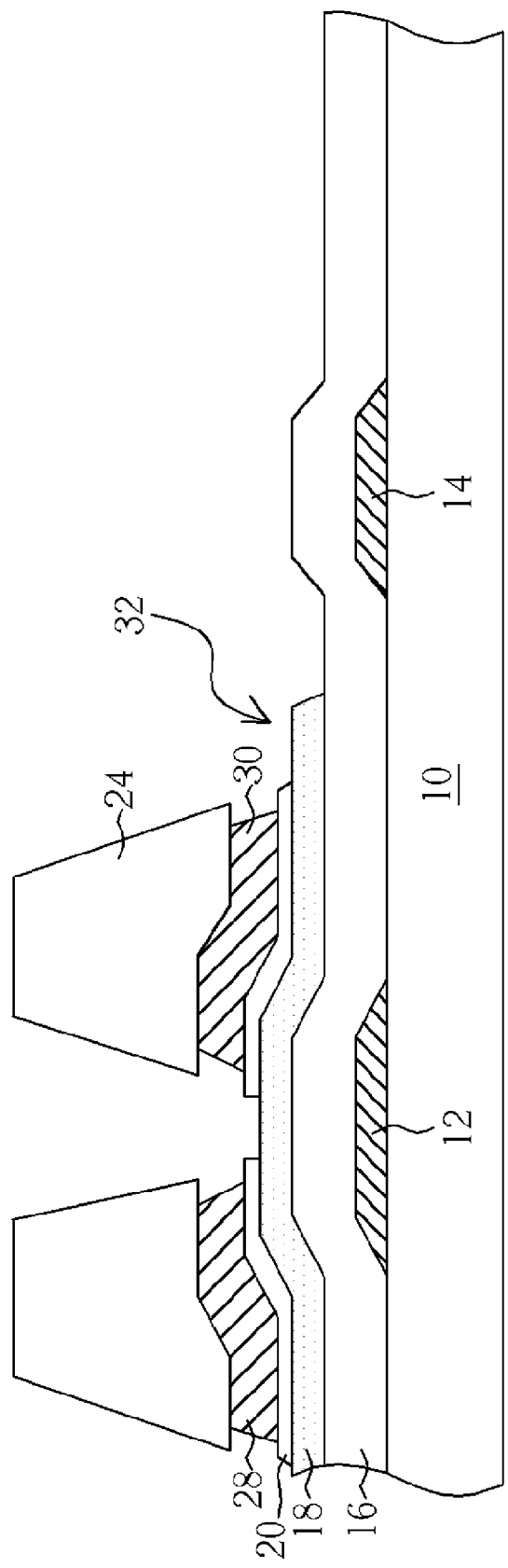
Figure 5:
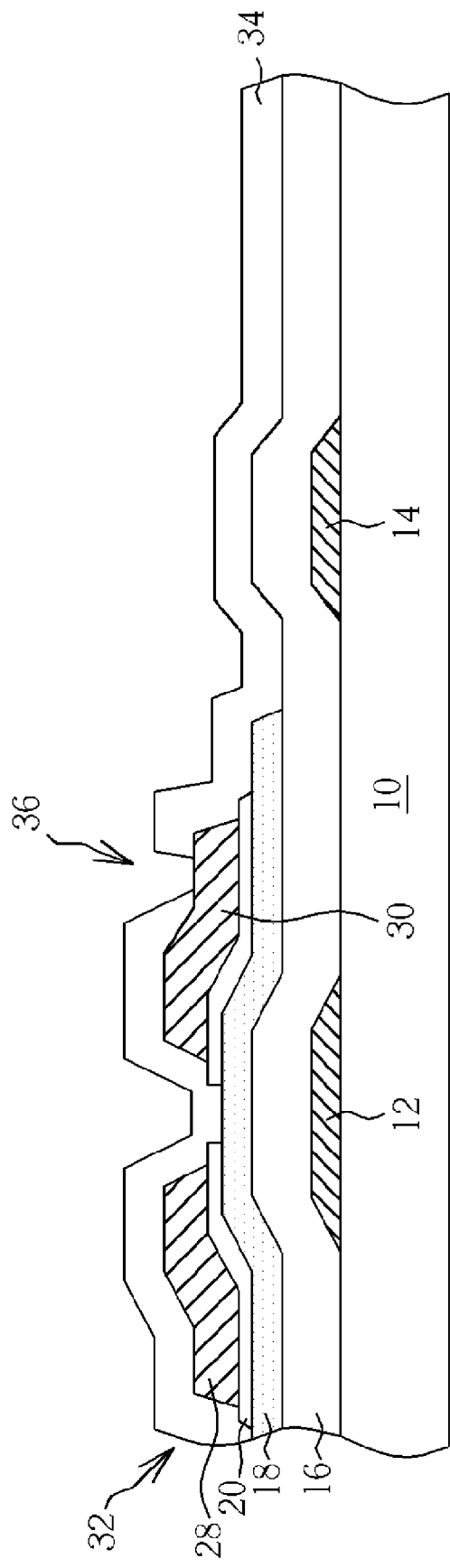
Figure 6:
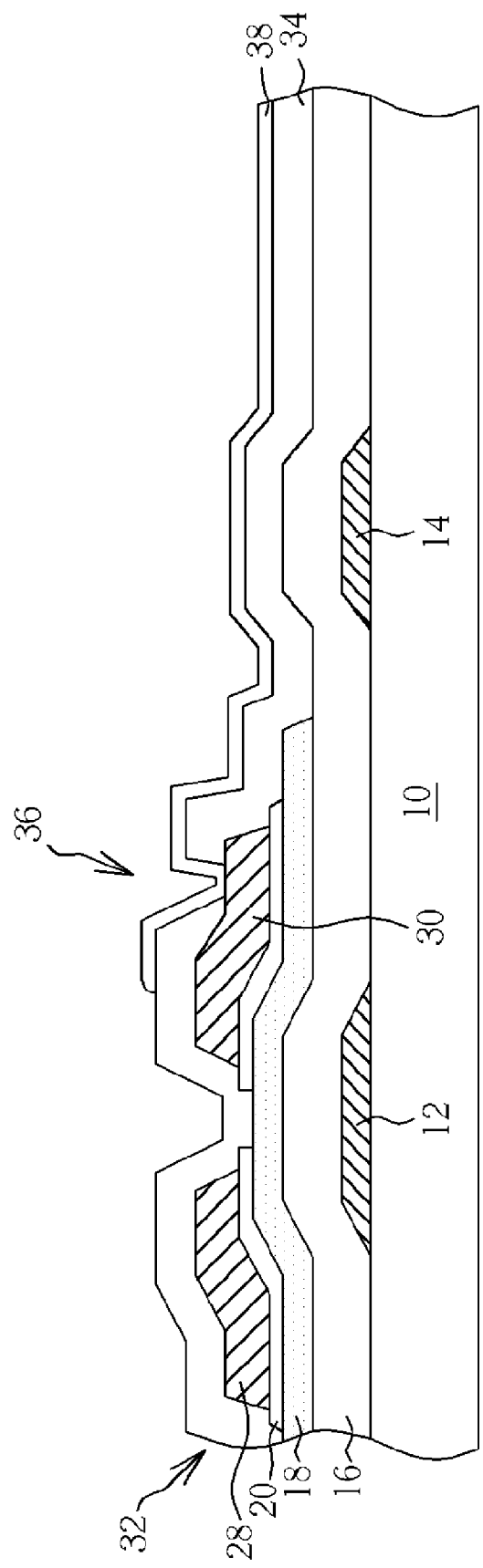
Figure 7:
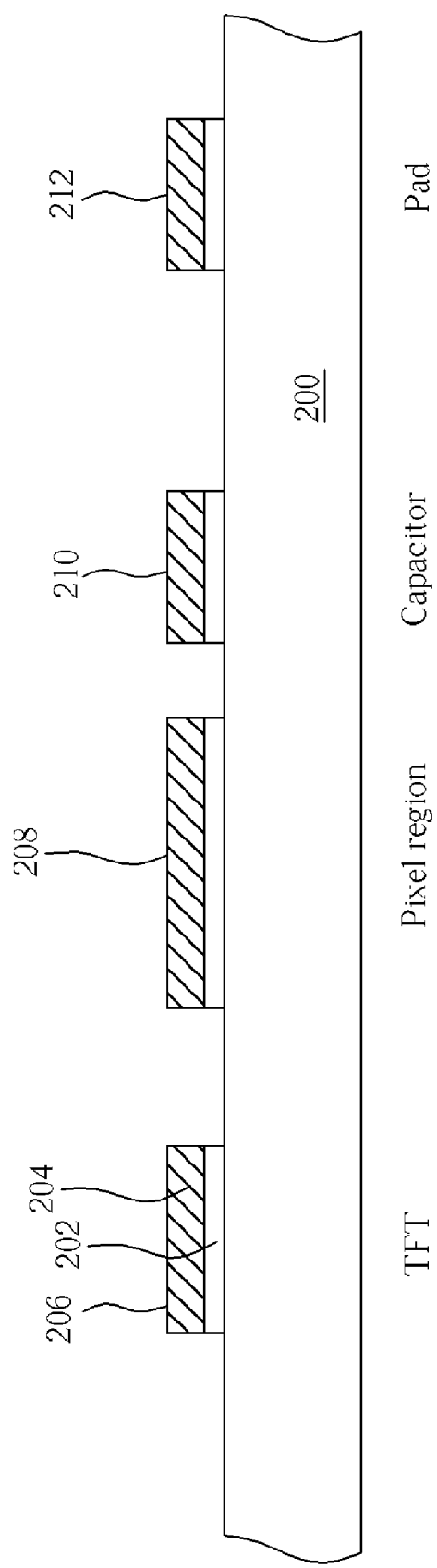
FIG. 7 through FIG. 12 are schematic diagrams of the fabrication process of a pixel structure according to a first embodiment of the present invention.

FIG. 7 through FIG. 12 are schematic diagrams of the fabrication process of a pixel structure according to a first embodiment of the present invention. Referring to FIG. 7, first, a substrate 200 is provided. The substrate 200 can be a transparent substrate of glass, quartz or comprising other materials. Then, a transparent conductive layer 202 and a metal layer 204 are formed on the substrate 200 in sequence. Next, a PEP is performed to pattern the transparent conductive layer 202 and the metal layer 204 so as to form a gate 206 of a TFT in a pixel region, a pixel electrode stack layer 208, a capacitor bottom electrode 210 and a pad stack layer 212 in a periphery circuit region. In other embodiments of the present invention, the gate 206 and the pixel electrode stack layer 208 or the pad stack layer 212 also can be fabricated separately. For example, the metal layer 204 may be formed first, and then, be patterned to form the gate 206. Next, the transparent conductive layer 202 is deposited, and then, a PEP is performed to form the pixel electrode stack layer 208.

Figure 8:
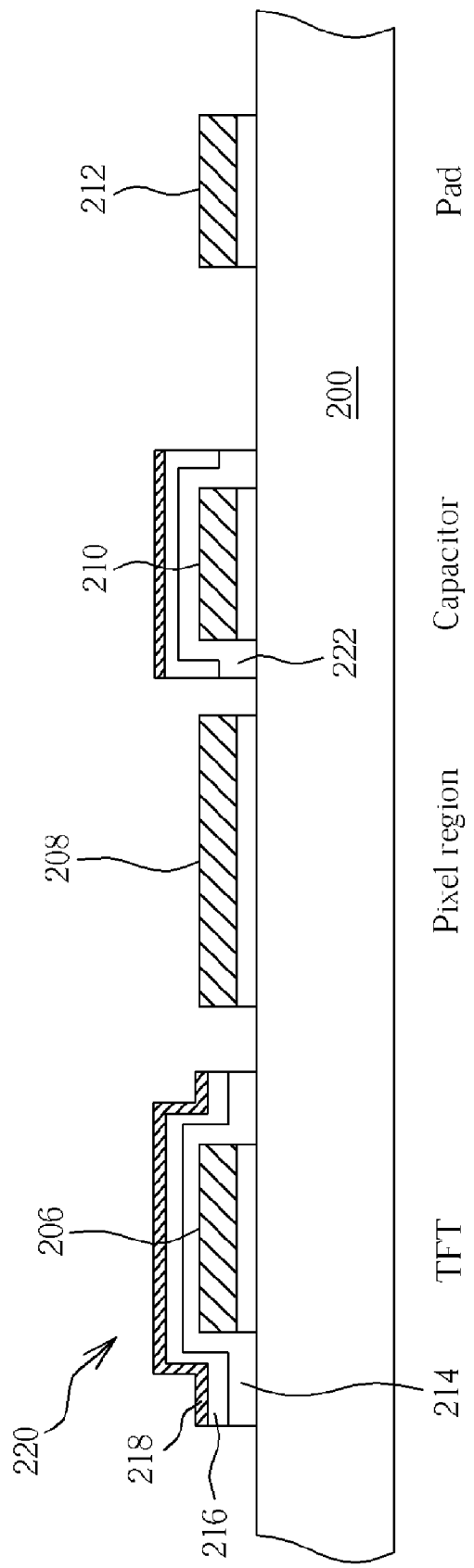

With reference to FIG. 8, a dielectric layer, a semiconductor layer and an N+ doped layer are successively deposited on the substrate 200. The semiconductor layer can comprise amorphous silicon layer. Then, another PEP is performed to form a patterned dielectric layer 214, a patterned semiconductor layer 216 and a patterned N+ doped layer 218 so as to define a pattern of a semiconductor island 220, wherein the patterned dielectric layer 214 covers the surface of the gate 206, and forms a capacitor dielectric layer 222 on the capacitor bottom electrode 210.

Figure 9:
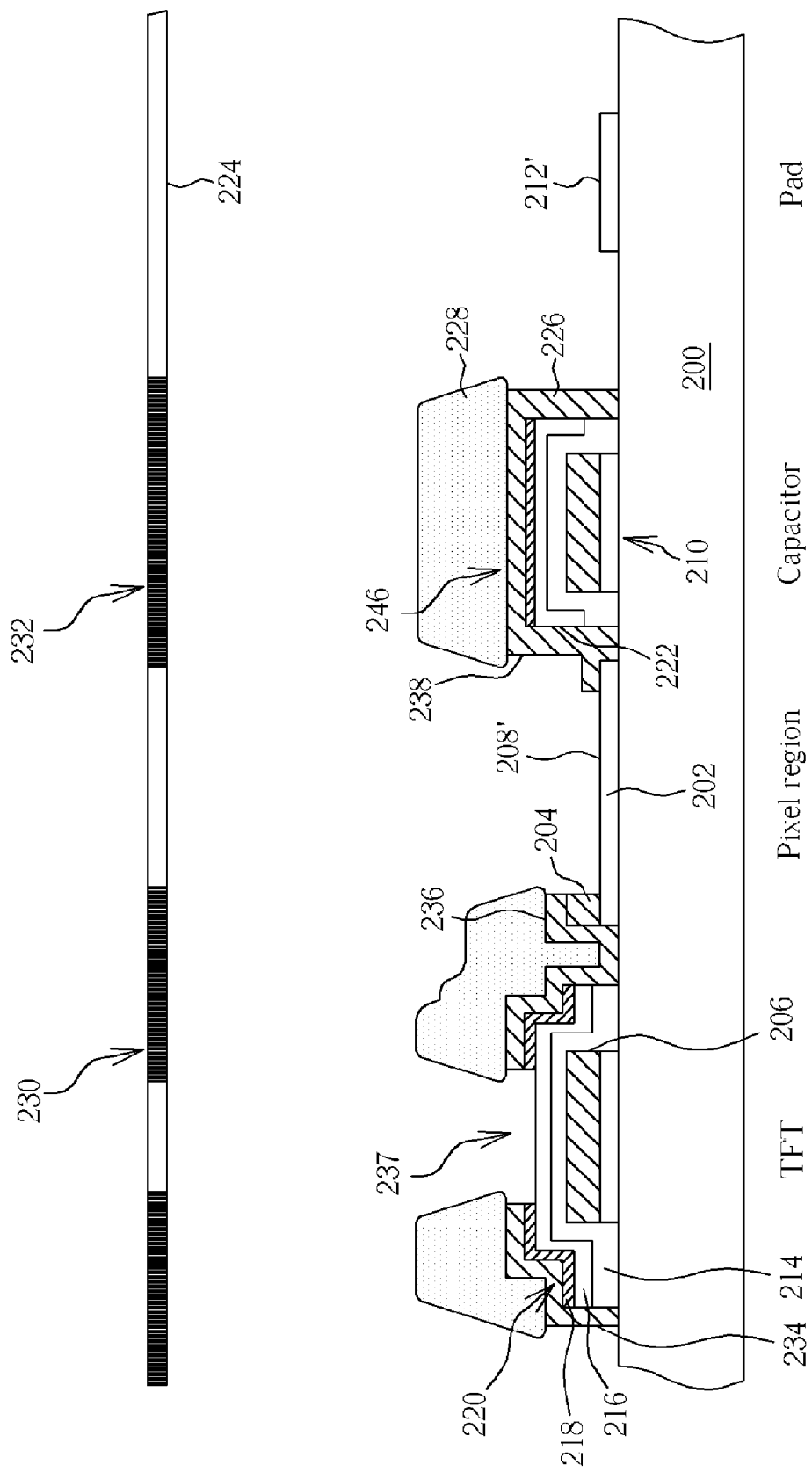

Next, as shown in FIG. 9, a conductive layer 226 with low resistance and a photoresist layer 228 are blanket deposited on the substrate 200. The conductive layer 226 may comprise metal materials, and the photoresist layer may comprise inorganic photosensitive materials. Then, a first lithographic process is performed by utilizing a photomask 224 to pattern the photoresist layer 228. The photomask 224 comprises a source/drain pattern 230 and a capacitor pattern 232. Subsequently, the patterned photoresist layer 228 is regarded as an etching mask, and an etching process is performed for the conductive layer 226 and the N+ doped layer 218 to form a source 234, a drain 236 and a capacitor top electrode 238 so as to fabricate a TFT 237 and a capacitor 246 and expose a part of the semiconductor layer 216 to be a channel of the TFT 237. The source 234 and the drain 236 are disposed on two sides of the patterned semiconductor layer 216. In addition, during the etching process, parts of the metal layer 204 of the pixel electrode stack layer 208 and the pad stack layer 212 are also removed at the same time so that a part of the transparent conductive layer 202 is exposed to be a pixel electrode 208' and a pad 212', and the drain 236 is electrically connected to the pixel electrode 208'.

Figure 10:
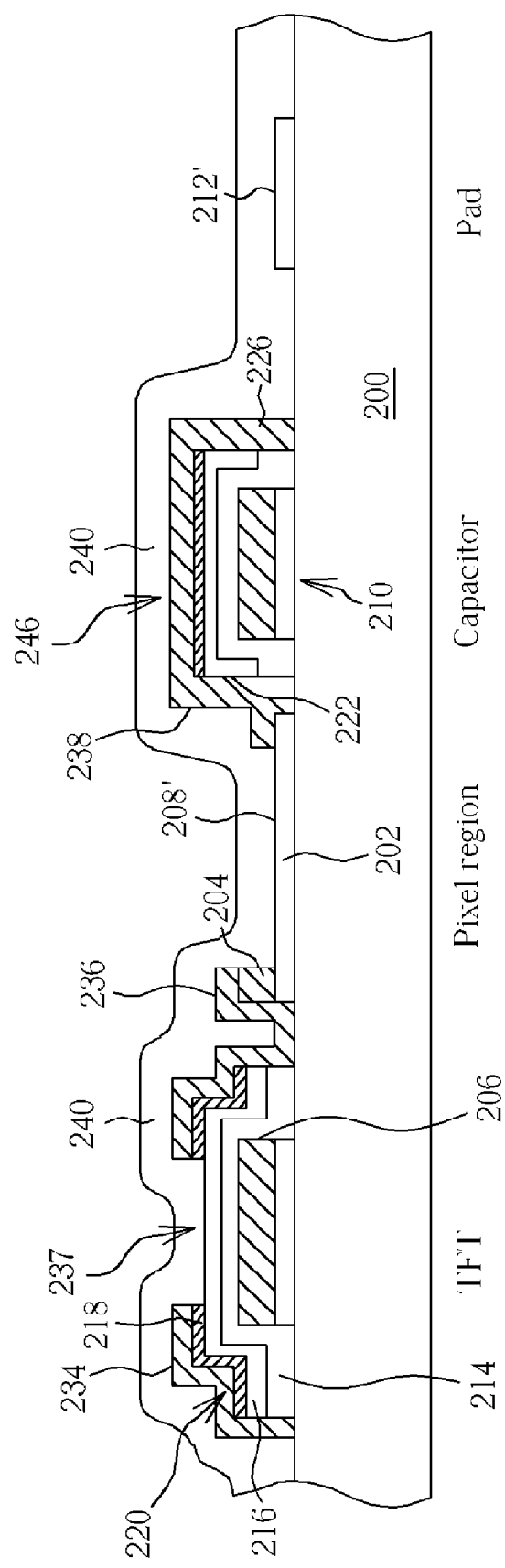
Figure 11:
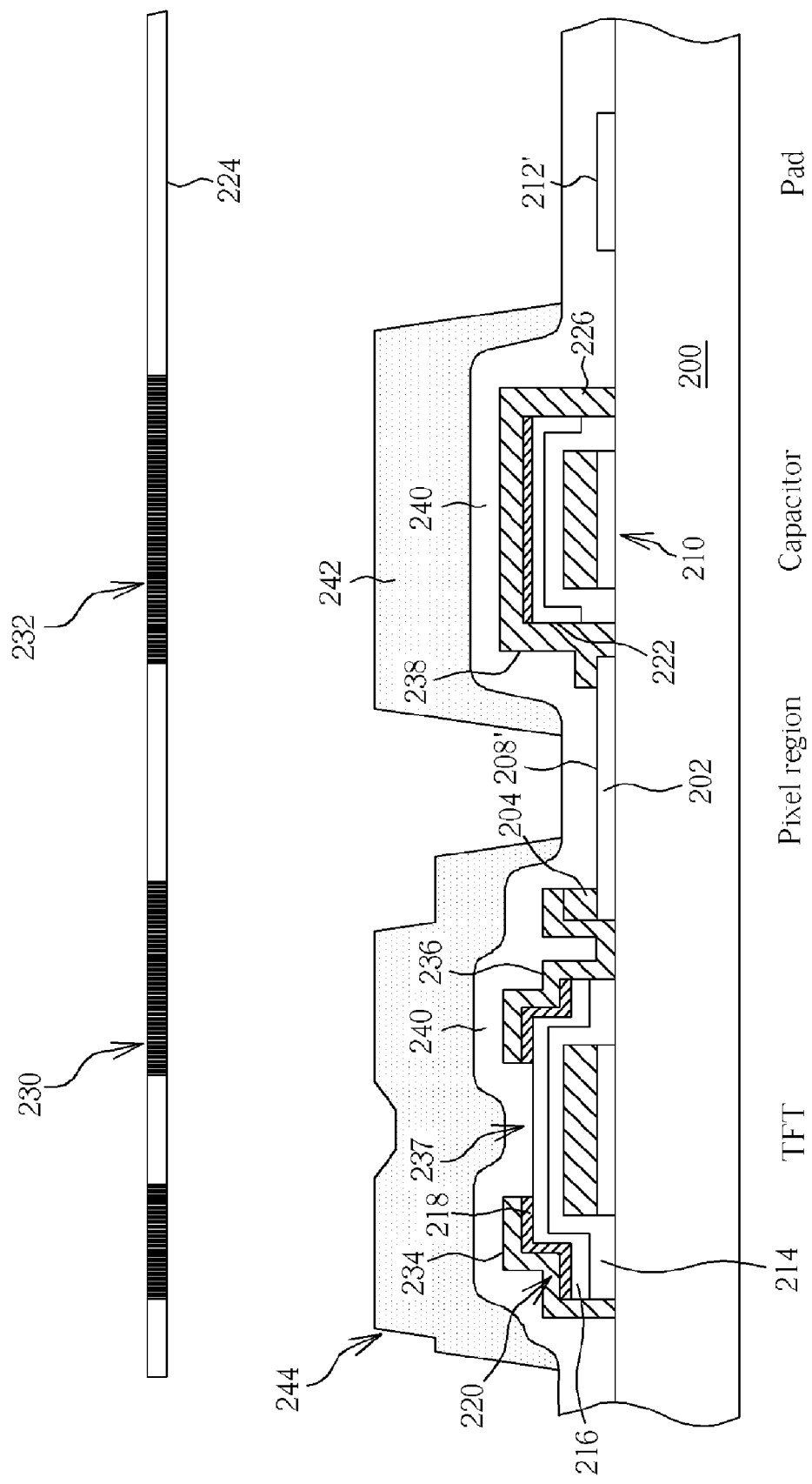

Referring to FIG. 10, the remnant patterned photoresist layer 228 is removed, and then, a passivation layer 240 is formed on the substrate 200. The passivation layer 240 can comprise inorganic materials, such as silicon nitride or silicon oxide. Next, as shown in FIG. 11, a second lithographic process is performed by utilizing the photomask 224 to pattern the passivation layer 240. The method of performing the second lithographic process is to deposit a photoresist layer 242 on the substrate 200 first, and then, the patterns of the photomask 224 are lithographed on the photoresist layer 242. The patterned photoresist layer 242 has a passivation-layer pattern 244 after a develop step. However, the passivation-layer pattern 244 has to be larger than the electrical devices underneath, such as the source 234, the drain 236 or the capacitor top electrode 238 so as to provide protection, while the photoresist layer 242 is patterned by utilizing the single photomask 224 comprising the source/drain pattern 230 and the capacitor pattern 232. Therefore, in the second lithographic process, the process parameters have to be adjusted to make the passivation-layer pattern 244 defined on the photoresist layer 242 be larger or wider than the source 234, the drain 236 and the capacitor top electrode 238. The aforementioned process parameters comprise a total exposure dose tuning, a pre-curing temperature of the photoresist layer 242 and a developing time. For example, in the lithographic process, if the total exposure dose tuning is larger, the line width of the pattern formed on the photoresist layer 242 will be narrower; if the pre-curing temperature is lower, the line width exposed on the photoresist layer 242 also will be narrower; and if the developing time is shorter, the patterned photoresist layer 242 will have larger line width. Therefore, the passivation-layer pattern 244 possessed by the photoresist layer 242 after developing is wider than the source 234, the drain 236 and the capacitor top electrode 238 through adjusting the condition of the process parameters, as shown in FIG. 11. In addition, a step of widening the patterned photoresist layer 242 also can be performed by utilizing a reflow method.

Figure 12:
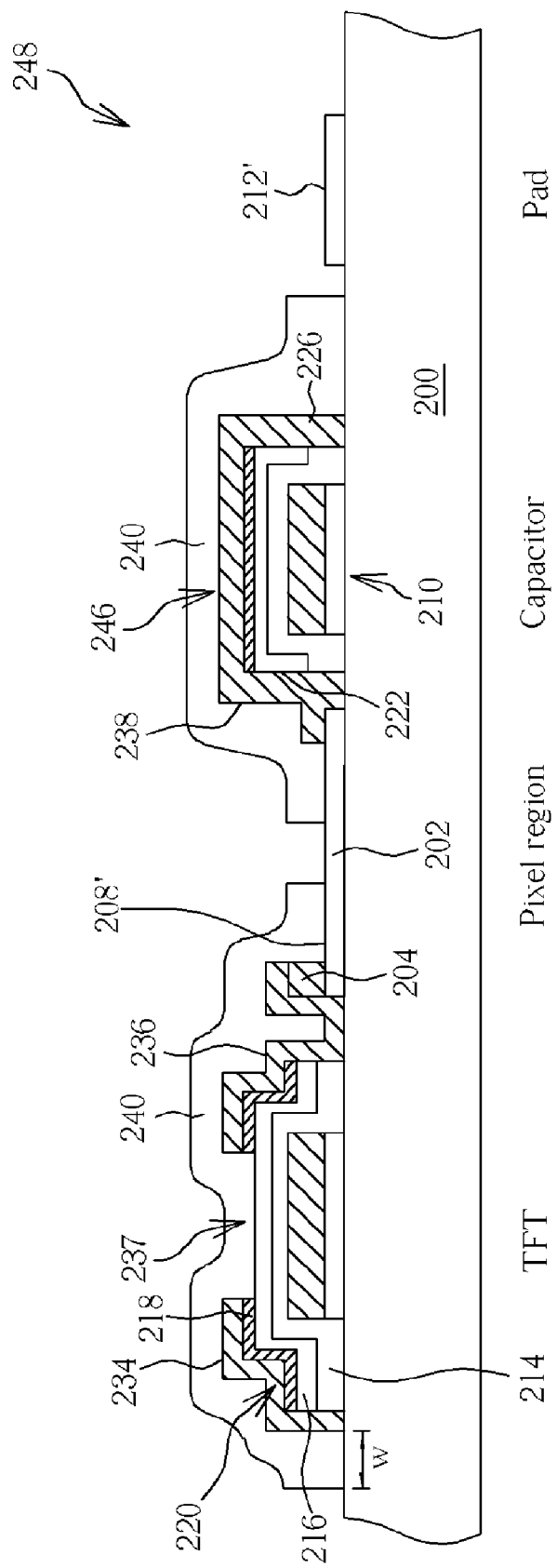

Next, referring to FIG. 12, the patterned photoresist layer 242 is utilized to be an etching mask, and an etching process is performed to remove a part of the passivation layer 240 not covered with the photoresist layer 242 and expose a part of the pixel electrode 208'. Subsequently, the remnant photoresist layer 242 is removed, and the fabrication of the pixel structure 248 of the present invention is finished. The patterned passivation layer 240 completely covers the devices of the TFT 237. For example, the patterned passivation layer 240 covers the sidewall surfaces of the source 234 and the drain 236, and is at least 0.5 μm wider than the source 234 and the drain 236, as the width difference w shown in figure. However, in other embodiments of the present invention, the passivation layer 240 having the pattern of the photomask 224 also can be reflowed to increase the pattern widths.

Figure 13:
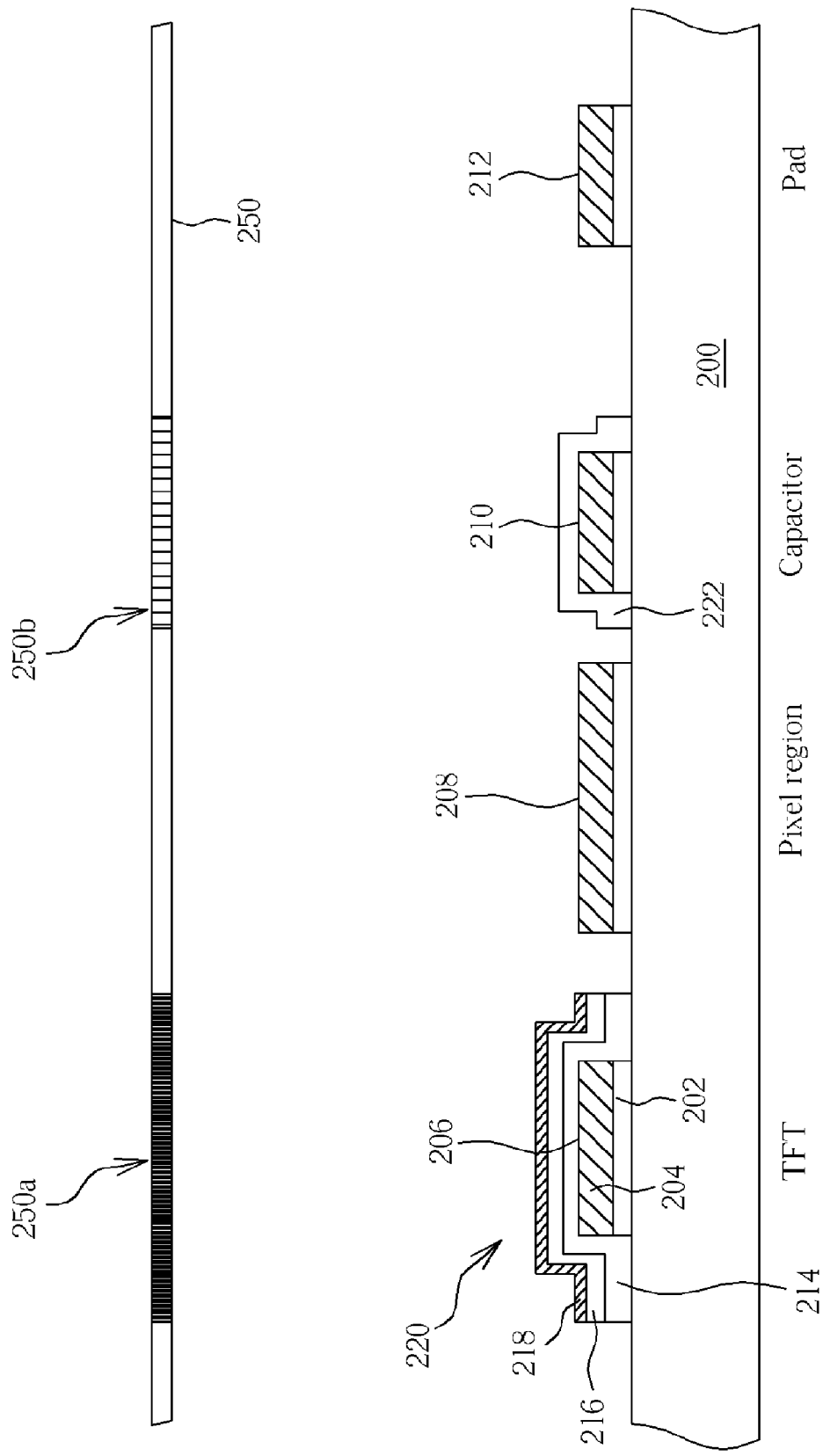
FIG. 13 and FIG. 14 are schematic diagrams of the fabrication process of a pixel structure according to a second embodiment of the present invention.
Figure 14:
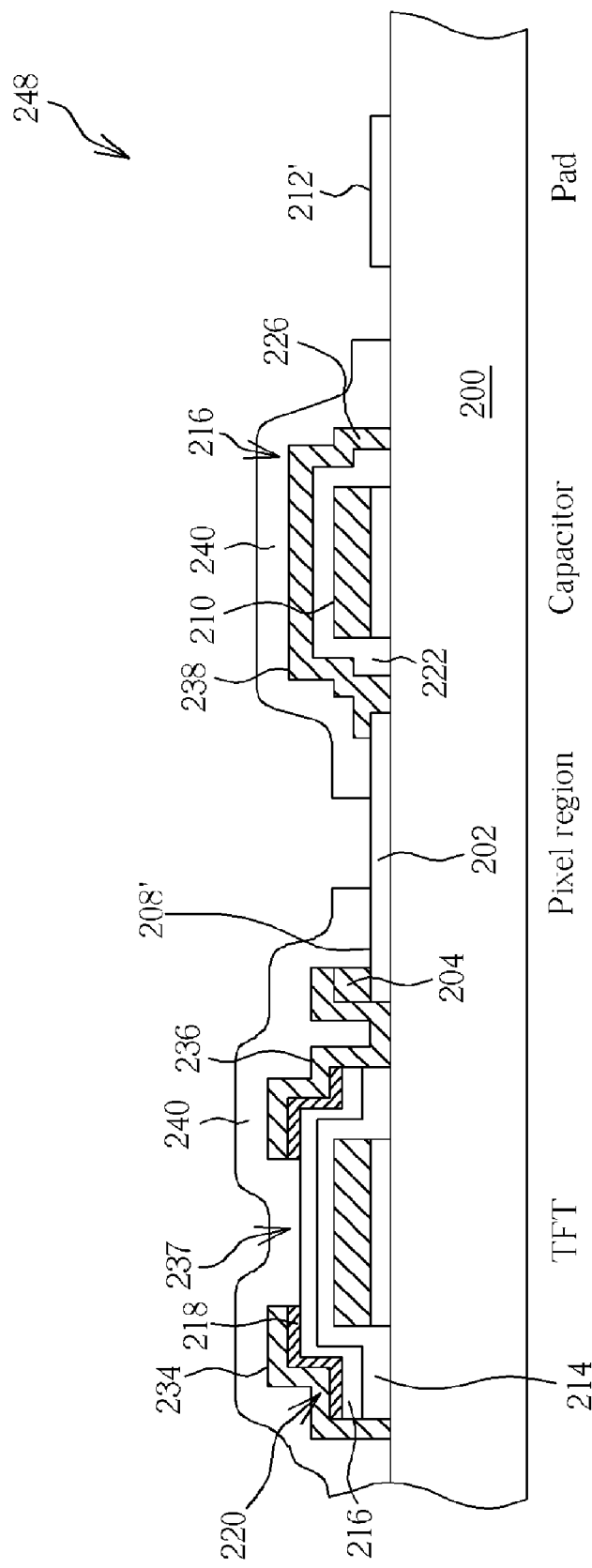

FIG. 13 and FIG. 14 are schematic diagrams of the fabrication process of a pixel structure according to a second embodiment of the present invention, wherein the numerals given to most elements are the same as that in FIGS. 7-12. FIG. 13 is the process following the FIG. 7. A dielectric layer 214, a semiconductor layer 216 and an N+ doped layer 218 are deposited on the substrate 200 in sequence after finishing the formation of the gate 206, the pixel electrode stack layer 208, the capacitor bottom electrode 210 and the pad stack layer 212. Next, a half-tone mask 250 or a gray-tone mask (not shown in figures) for defining the patterns of the semiconductor island and the capacitor dielectric layer is provided. The half-tone mask 250 comprises an opaque region 250a and a half-tone region 250b, wherein the opaque region 250a is utilized to define the semiconductor island, and the half-tone region 250b is corresponding to the pattern of the capacitor dielectric layer. A PEP is performed by utilizing the half-tone mask 250 to pattern the dielectric layer 214, the semiconductor layer 216 and the N+ doped layer 218 so as to form a semiconductor island 220 disposed on the dielectric layer 214 and simultaneously expose the dielectric layer 214 on the capacitor bottom electrode 210 to form the capacitor dielectric layer 222. In other embodiments of the present invention, the step of patterning the dielectric layer 214, the semiconductor layer 216 and the N+ doped layer 218 also can be fabricated through two photomasks with different exposure energy.

Next, the method similar to that of the first embodiment shown in FIGS. 10-12 is utilized to fabricate the source 234, the drain 236 and the capacitor top electrode 238, disposed on the semiconductor island 220, and the passivation layer 240 covering the TFT 237 and the capacitor 246 through several deposition processes combined with the first and second lithographic processes by utilizing the photomask 224. As shown in FIG. 14, the pixel structure 248 according to the second embodiment of the present invention is finished.

Figure 15:
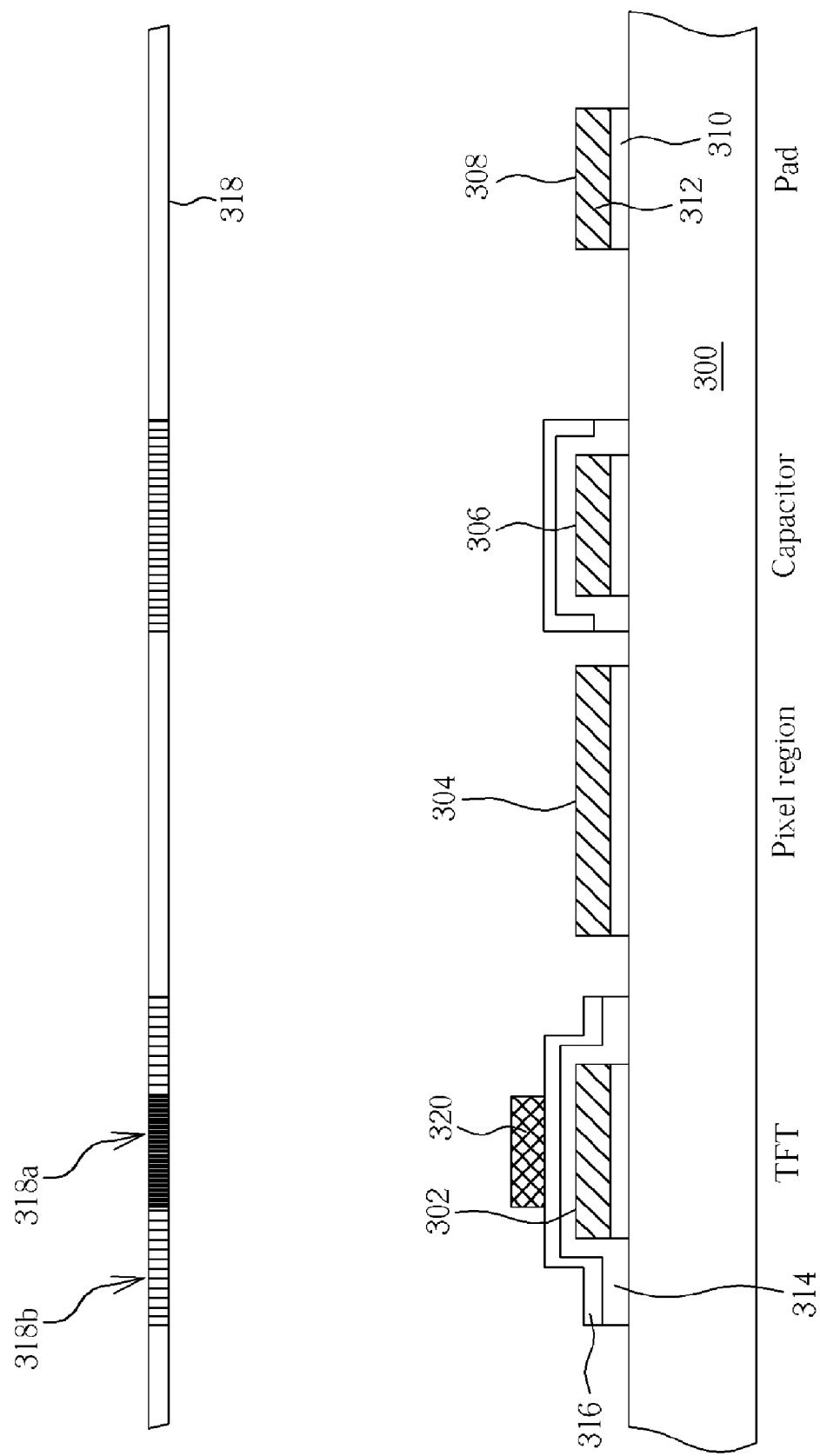
FIG. 15 through FIG. 17 are schematic diagrams of the fabrication process of a pixel structure according to a third embodiment of the present invention.
Figure 16:
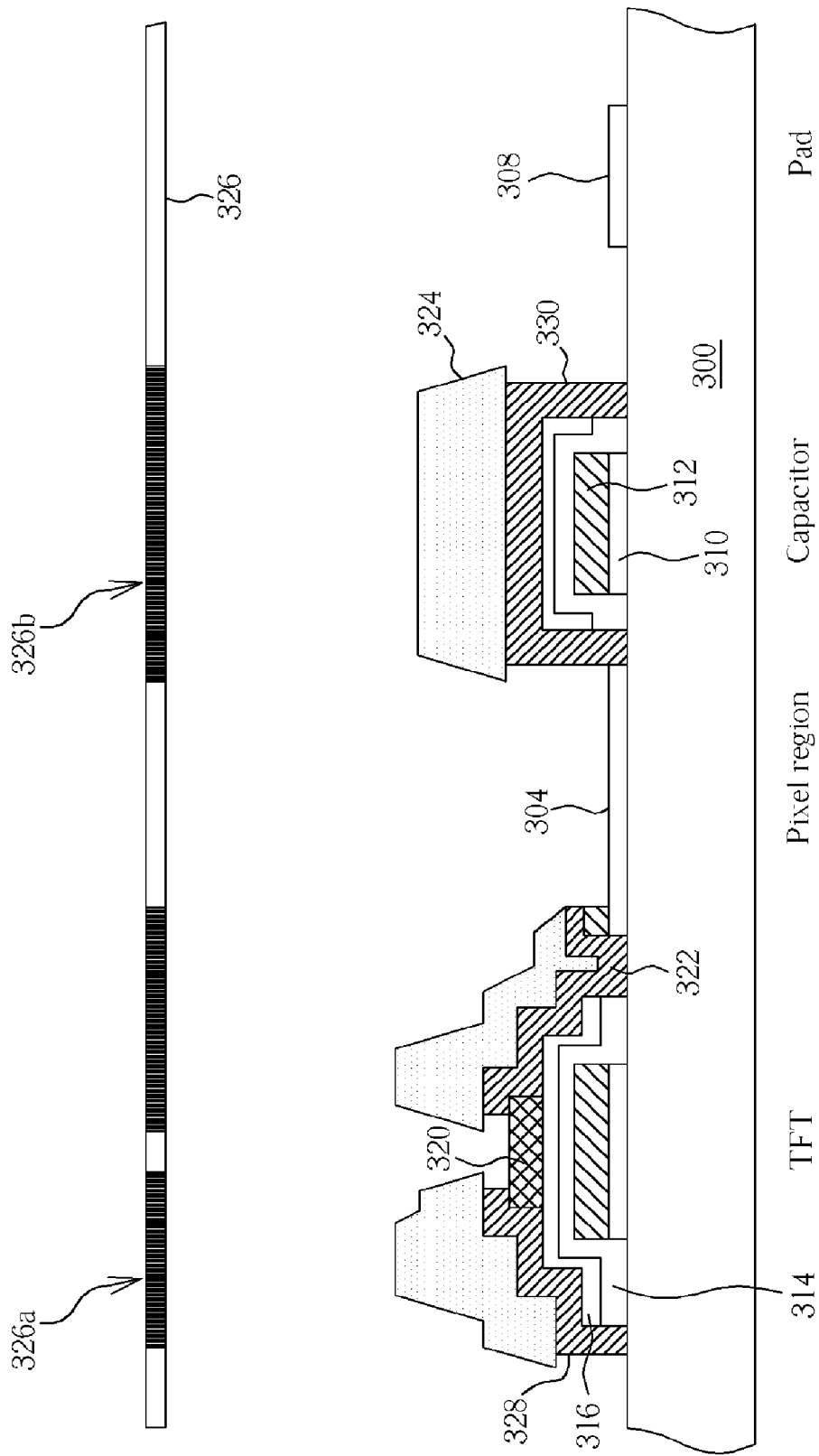
Figure 17:
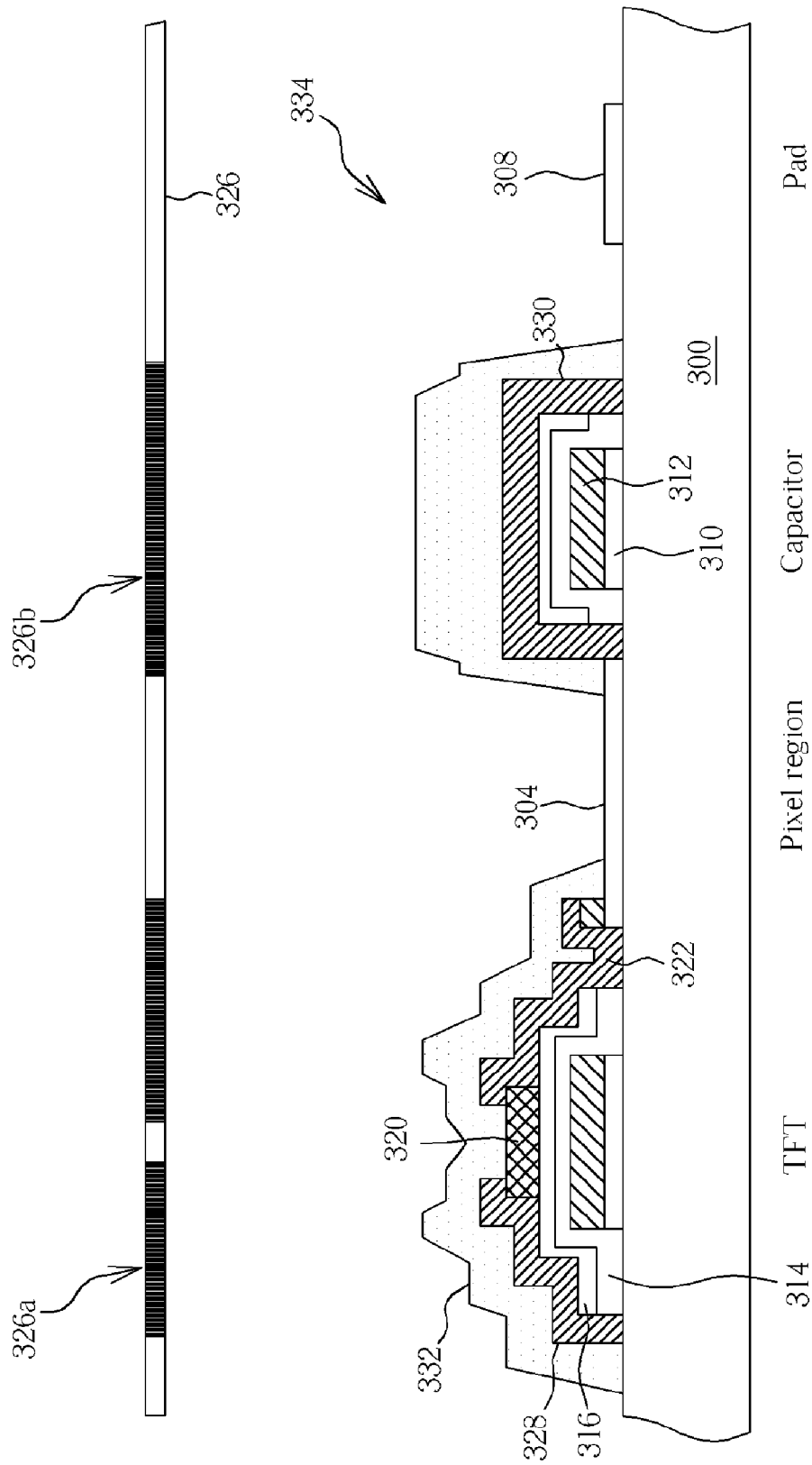

In other embodiments of the present invention, an organic photosensitive material also can be utilized to replace the inorganic material of the passivation layer used in the aforementioned embodiments so as to omit the step of fabricating the photoresist layer during the second lithographic process. FIG. 15 through FIG. 17 are schematic diagrams of the fabrication process of a pixel structure according to a third embodiment of the present invention. First, as shown in FIG. 15, a gate 302 of a TFT, a pixel electrode stack layer 304, a capacitor bottom electrode 306 and a pad stack layer 308 are fabricated on a transparent substrate 300, which are all stack-layer structures composed of a transparent conductive layer 310 and a metal layer 312. Subsequently, a first dielectric layer 314, a semiconductor layer 316 and a second dielectric layer are formed on the transparent substrate 300 in sequence, wherein the first dielectric layer 314 and the second dielectric layer can comprise materials, such as silicon nitride, silicon oxynitride or silicon oxide, etc. Next, a PEP is performed by utilizing a half-tone mask 318 or a gray-tone mask (not shown in figures) to pattern the first dielectric layer 314, the semiconductor layer 316 and the second dielectric layer so that the semiconductor layer 316 on the gate 302 is formed as a semiconductor island, the first dielectric layer 314 is formed as a gate insulation layer and a capacitor dielectric layer in the TFT, and the remnant second dielectric layer is regarded as a channel passivation layer 320 covering the channel region of the TFT. As shown in FIG. 15, the half-tone mask 318 has an opaque region 318a and a half-tone region 318b respectively corresponding to the channel passivation layer 320 and the patterned semiconductor layer 316.

Next, with reference to FIG. 16, a conductive layer 322 comprising metal materials and a photoresist layer 324 comprising inorganic photosensitive materials are formed on the transparent substrate 300 in sequence. A first lithographic process is performed by utilizing a photomask 326 comprising a source/drain pattern 326a and a capacitor pattern 326b to pattern the photoresist layer 324. Then, the patterned photoresist layer 324 is utilized to be a mask, and a part of the conductive layer 322 and the metal layer 312 under the conductive layer 322 not covered with the photoresist layer 324 are etched to form the source/drain 328 and the capacitor top electrode 330. At the same time, a part of the metal layer 312 of the pixel electrode stack layer 304 and the pad stack layer 308 is removed.

Finally, as shown in FIG. 17, the patterned photoresist layer 324 is removed, and then, an organic passivation layer 332 having photosensitivity is deposited on the transparent substrate 300. A second lithographic process is performed by utilizing the photomask 326 to pattern the organic passivation layer 332. Because the organic passivation layer 332 itself has the quality of photosensitivity, it is not required to further fabricate a photoresist layer on the organic passivation layer 332. The organic passivation layer 332 can be directly exposed during the second lithographic process so that the patterns of the photomask 326 are lithographed and transferred on the organic passivation layer 332. Then, the organic passivation layer 332 is patterned after a develop step, and parts of the organic passivation layer 332 without the source/drain pattern 326a and the capacitor pattern 326b of the photomask 326 are removed. In the second lithographic process, the pattern of the organic passivation layer 332 can be patterned to be wider than the source/drain 328 and the capacitor top electrode 330, such as at least 0.5 μm wider, through adjusting the process parameters, such as total exposure dose tuning and developing time, etc., such that the passivation layer 332 covers the sidewall surfaces of the source/drain 328. Besides, parts of the organic passivation layer 332 with the patterns of the photomask 326 can be reflowed to widen the patterns of the organic passivation layer 332 after developing. Accordingly, the fabrication of a pixel structure 334 of the third embodiment of the present invention is finished.

It is an advantage of the present invention that only a single photomask is utilized during the first and second lithographic processes to define patterns of the source/drain and the passivation layer respectively so that the total amount of photomasks of the fabrication process can be reduced. Furthermore, in the aforementioned process according to the first embodiment of the present invention, the half-tone mask or gray-tone mask is not required so that the fabrication cost of the photomasks also can be reduced. In addition, the passivation layer defined during the second lithographic process completely covers the electrical devices, such as source/drain and capacitor, so that the operating efficiency of the pixel structure can be increased. Compared with the prior art, the process of the present invention only requires three photomasks for fabricating the pixel structure such that the total amount of fabrication tools used in the whole fabrication process can be reduced, saving raw materials and hardware equipments. And also, the usages of the precise equipments, such as half-tone mask, can be reduced to effectively increase the capacity of production and the quality of the product. Therefore, the cost of the whole product fabrication is reduced.

Those skilled in the art will readily observe that numerous modifications and alterations of the device and method may be made while retaining the teachings of the invention.

What is claimed is:
1. A fabrication method of a pixel structure, comprising:
providing a substrate;
forming a gate and a pixel electrode on the substrate;
forming a dielectric layer and a semiconductor layer on the substrate;
patterning the dielectric layer and the semiconductor layer to form a patterned dielectric layer and a patterned semiconductor layer on the gate;
forming a conductive layer on the substrate;

providing a photomask and performing a first lithographic process to pattern the conductive layer by utilizing the photomask to form a source and a drain on the patterned semiconductor layer, the drain being electrically connected to the pixel electrode;

forming a passivation layer on the substrate; and performing a second lithographic process by utilizing the photomask to form a patterned passivation layer covering the source, the drain and the semiconductor layer and exposing a part of the pixel electrode.

2. The fabrication method of claim 1, wherein the patterned passivation layer covers sidewall surfaces of the source and the drain.

3. The fabrication method of claim 1, wherein the patterned passivation layer is at least 0.5 μm wider than the size of the source or the drain.

4. The fabrication method of claim 1, wherein the step of forming the patterned passivation layer by the second lithographic process comprises:

forming a photoresist layer on the passivation layer;

patterning the photoresist layer by utilizing the photomask to form a plurality of the patterns of the patterned photoresist layer, wherein the patterns of the patterned photoresist layer are wider than the source and the drain;

performing an etching process by utilizing the patterned photoresist layer as a mask to remove a part of the passivation layer not covered with the photoresist layer; and removing the remnant photoresist layer.

5. The fabrication method of claim 1, wherein the passivation layer comprises a photosensitive material, and the step of forming the patterned passivation layer by the second lithographic process comprises:

defining patterns of the photomask on the passivation layer by utilizing the photomask; and performing a developing process to remove a part of the passivation layer not containing the patterns of the photomask.

6. The fabrication method of claim 5, further comprising reflowing a part of the passivation layer containing the patterns of the photomask.

7. The fabrication method of claim 1, wherein the step of forming the gate and the pixel electrode on the substrate comprises:

forming a transparent conductive layer on the substrate;

forming a metal layer on the transparent conductive layer; and patterning the transparent conductive layer and the metal layer to form the gate and the pixel electrode, wherein the gate comprises the transparent conductive layer and the metal layer, and the pixel electrode comprises the transparent conductive layer.

8. The fabrication method of claim 1, further comprising forming a channel passivation layer on the patterned semiconductor layer.

9. A fabrication method of a pixel structure, comprising:

providing a substrate;

forming a transparent conductive layer and a metal layer on the substrate in sequence;

patterning the transparent conductive layer and the metal layer to form a gate and a pixel electrode stack layer, wherein the gate and the pixel electrode stack layer both comprise the transparent conductive layer and the metal layer;

forming a dielectric layer and a semiconductor layer on the substrate;

patterning the dielectric layer and the semiconductor layer to form a patterned dielectric layer and a patterned semiconductor layer on the gate;

forming a conductive layer covering the substrate;

providing a photomask and performing a first lithographic process to pattern the conductive layer and the metal layer by utilizing the photomask so as to form a source and a drain and to expose a part of the transparent conductive layer of the pixel electrode stack layer as a pixel electrode;

forming a passivation layer on the substrate; and performing a second lithographic process by utilizing the photomask to form a patterned passivation layer covering the source, the drain and the semiconductor layer and expose a part of the pixel electrode.

10. The fabrication method of claim 9, wherein the patterned passivation layer covers sidewall surfaces of the source and the drain.

11. The fabrication method of claim 9, wherein the patterned passivation layer is at least 0.5 μm wider than the source or the drain.

12. The fabrication method of claim 9, wherein the step of forming the patterned passivation layer by the second lithographic process comprises:

forming a photoresist layer on the passivation layer;

patterning the photoresist layer by utilizing the photomask to form a plurality of the patterns of the patterned photoresist layer, wherein the patterns of the patterned photoresist layer is wider than the source and the drain;

performing an etching process by utilizing the patterned photoresist layer as a mask to remove a part of the passivation layer not covered with the photoresist layer; and removing the remnant photoresist layer.

13. The fabrication method of claim 9, wherein the passivation layer comprises an organic photosensitive material, and the step of forming the patterned passivation layer by the second lithographic process comprises:

defining patterns of the photomask on the passivation layer by utilizing the photomask; and performing a developing process to remove a part of the passivation layer not containing the patterns of the photomask; and reflowing a part of the passivation layer containing the patterns of the photomask.

14. The fabrication method of claim 9, further comprising forming a channel passivation layer on the semiconductor layer.

15. The fabrication method of claim 9, further comprising forming a capacitor on the substrate, wherein the step of forming the capacitor comprising:

forming a capacitor bottom electrode on the substrate when patterning the transparent conductive layer and the metal layer;

forming the patterned dielectric layer and the patterned semiconductor layer on the capacitor bottom electrode simultaneously when patterning the dielectric layer and the semiconductor layer; and forming a capacitor top electrode composed of the conductive layer on the patterned semiconductor layer when patterning the conductive layer and the metal layer.

16. The fabrication method of claim 15, wherein the capacitor bottom electrode comprises the transparent conductive layer and the metal layer.

17. The fabrication method of claim 9, further comprising forming a capacitor on the substrate, wherein the step of forming the capacitor comprises:

forming a capacitor bottom electrode on the substrate when patterning the transparent conductive layer and the metal layer;

forming the patterned dielectric layer on the capacitor bottom electrode simultaneously when patterning the dielectric layer and the semiconductor layer; and forming a capacitor top electrode composed of the conductive layer on the patterned dielectric layer simultaneously when patterning the conductive layer and the metal layer.

18. The fabrication method of claim 17, wherein the step of patterning the dielectric layer and the semiconductor layer comprises a half-tone photomask process, a gray-tone photomask process or utilizing two photomasks with different exposure dose tunings.

19. The fabrication method of claim 9, further comprising forming a pad on the substrate, wherein the step of forming the pad comprises:

forming a pad stack layer composed of the transparent conductive layer and the metal layer on the substrate when patterning the transparent conductive layer and the metal layer; and exposing a part of the transparent conductive layer of the pad stack layer as the pad when patterning the conductive layer and the metal layer.

* * * * *